(12) United States Patent
Deak et al.

(10) Patent No.: US 10,401,440 B2
(45) Date of Patent: Sep. 3, 2019

(54) SINGLE-PACKAGE HIGH-FIELD MAGNETORESISTIVE ANGLE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang, Jiangsu (CN)

( * ) Notice: Subject to any disclaimer, the term of this patent is extended or adjusted under 35 U.S.C. 154(b) by 122 days.

(21) Appl. No.: 15/566,019

(22) PCT Filed: Apr. 7, 2016

(86) PCT No.: PCT/CN2016/078639
§ 371 (c)(1),
(2) Date: Dec. 28, 2017

(87) PCT Pub. No.: WO2016/165578
PCT Pub. Date: Oct. 20, 2016

(65) Prior Publication Data
US 2018/0113179 A1  Apr. 26, 2018

(30) Foreign Application Priority Data
Apr. 16, 2015  (CN) .......................... 2015 1 0181008

(51) Int. Cl.
*G01R 33/00* (2006.01)
*G01R 33/10* (2006.01)
(Continued)

(52) U.S. Cl.
CPC ............. *G01R 33/093* (2013.01); *G01B 7/30* (2013.01); *G01D 5/145* (2013.01);
(Continued)

(58) Field of Classification Search
CPC ...... G01D 5/145; G01D 11/245; G01D 3/022; G01D 5/202; G01R 33/093; G01R 33/09; G01R 31/2829; G01R 33/06
(Continued)

(56) References Cited

U.S. PATENT DOCUMENTS 8,283,184 B2    10/2012  Ruhrig et al.
2005/0140363 A1  6/2005  Grimm et al.
(Continued)

FOREIGN PATENT DOCUMENTS

CN    102297652    12/2011
CN    202119390    1/2012
(Continued)

OTHER PUBLICATIONS

"International Application No. PCT/CN2016/078639, International Search Report and Written Opinion dated Jun. 29, 2016", (Jun. 29, 2016), 12 pgs.

*Primary Examiner* — Giovanni Astacio-Oquendo
*Assistant Examiner* — Raul J Rios Russo
(74) *Attorney, Agent, or Firm* — Schwegman Lundberg & Woessner, P.A.

(57) ABSTRACT

A single-package high-field magnetoresistive angle sensor, comprising at least one push-pull magnetoresistive bridge and soft magnetic flux attenuators located on the push-pull magnetoresistive bridge. The push-pull magnetoresistive bridge comprises a plurality of magnetoresistive sensor units. The magnetoresistive sensor units are of an MTJ or GMR type. Each magnetoresistive sensor unit comprises at least one pinned layer, one ferromagnetic reference layer, a nonmagnetic spacer layer, and a ferromagnetic free layer. The ferromagnetic free layer is a low aspect ratio oval or circle, which can make the intensity of magnetization of the ferromagnetic free layer align along an external magnetic
(Continued)

field in any direction. The soft magnetic flux attenuator covers the surface of all the magnetoresistive sensor units to attenuate the high intensity external magnetic field to be within a measurable range of the magnetoresistive sensor units; the push-pull magnetoresistive bridge has antiparallel or mutually-orthogonal magnetization directions of the reference layer. The magnetoresistive angle sensor can measure the rotation angle of a high-intensity magnetic field. It has the advantages of low power consumption and small size.

20 Claims, 12 Drawing Sheets

(51) Int. Cl.
*G01R 33/09* (2006.01)
*G01R 31/28* (2006.01)
*G01R 33/06* (2006.01)
*G01B 7/30* (2006.01)
*G01D 5/14* (2006.01)

(52) U.S. Cl.
CPC ..... *G01R 31/2829* (2013.01); *G01R 33/0076* (2013.01); *G01R 33/06* (2013.01); *G01R 33/09* (2013.01)

(58) Field of Classification Search
USPC .................................................. 324/200–263
See application file for complete search history.

(56) References Cited

U.S. PATENT DOCUMENTS

| 2016/0245877 | A1* | 8/2016 | Deak | G01R 33/093 |
| 2017/0123016 | A1* | 5/2017 | Deak | G01R 33/04 |
| 2017/0176545 | A1* | 6/2017 | Deak | G01R 33/0011 |

FOREIGN PATENT DOCUMENTS

| CN | 104246525 | 12/2014 |
| CN | 104776794 | 7/2015 |
| CN | 204739999 | 11/2015 |
| WO | WO-2016165578 | 10/2016 |

* cited by examiner

SINGLE-PACKAGE HIGH-FIELD MAGNETORESISTIVE ANGLE SENSOR

PRIORITY CLAIM TO RELATED APPLICATIONS

This application is a U.S. national stage application filed under 35 U.S.C. § 371 from International Application No. PCT/CN2016/078639, which was filed 7 Apr. 2016, and published as WO2016/165578 on 20 Oct. 2016, and which claims priority to Chinese Application No. 201510181008.7, filed 16 Apr. 2015, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a single-package high-field magnetoresistive angle sensor.

BACKGROUND ART

FIG. 1 is a structural diagram of a magnetic multi-layer thin film 1 forming a GMR-type or TMR-type angle sensor, including an anti-ferromagnetic layer 2, a ferromagnetic reference layer 3, a nonmagnetic spacer layer 4 and a ferromagnetic free layer 5. Resistance between two ends of the magnetic multi-layer thin film is under the control of a relative angle between the ferromagnetic free layer 5 and the ferromagnetic reference layer 3. In actual operation, as shown in FIG. 2, a rotary permanent magnet 6 generates a rotational magnetic field 8 on the surface of a packaged GMR-type or TMR-type angle sensor chip 7. The rotational magnetic field 8 is required to be greater than the saturation magnetic field value of the ferromagnetic free layer 5 and smaller than the pinning field value of the ferromagnetic reference layer 3. In this case, the magnetization direction of the ferromagnetic free layer 5 is the same as the direction of the rotational magnetic field 8. The angle of the rotational magnetic field is measured by measuring a change in the resistance between two ends of the magnetic multi-layer thin film 1 as the angle of the rotational magnetic field changes. FIG. 3 shows a biaxial angle sensor, i.e., the sensor includes a multi-layer thin film structure with a ferromagnetic reference layer along the X-axis direction and a multi-layer thin film structure with a ferromagnetic reference layer along the Y-axis direction, and output signals of the structures at two ends are a sine signal 9 and a cosine signal 10. An angle signal value of the biaxial angle sensor is obtained by means of arctangent calculation on the output signals thereof.

However, actually, the amplitude of the rotational external magnetic field of an angle sensor designed by using the foregoing GMR-type or TMR-type magnetic multi-layer thin film structure should be less than 300 G, and a rotational external magnetic field with higher amplitude may cause the ferromagnetic reference layer 3 to rotate, thus generating a non-linear output. FIG. 4 shows an ideal angle signal curve 11. When the rotational magnetic field is 50 Oe, an output curve 12 thereof is close to the ideal sine-cosine curve 11, and when the rotational external magnetic field exceeds 400 Oe, an output curve 13 thereof deviates from the ideal curve 11 and becomes triangular, thus generating an angle error curve 14.

However, many applications require the amplitude of the working rotational external magnetic field to be greater than 300 G, and also require a low non-linear error. Therefore, it is urgent to develop a novel angle sensor that can operate in the presence of a high intensity rotational magnetic field while generating low non-linearity error.

SUMMARY OF THE INVENTION

To solve the problem of the nonlinearity error of the angle sensor due to rotation of the magnetic moment of the ferromagnetic reference layer 3 when the amplitude of the rotational magnetic field is higher than 300 G, the present invention provides a single-package high-field magnetoresistive angle sensor. By providing a cover layer of soft magnetic thin film material as a flux attenuator on the surface of a magnetic multi-layer thin film structure 1 of a GMR-type or TMR-type angle sensor shown in FIG. 1, the rotational magnetic field with an amplitude higher than 300 G is attenuated, so that the amplitude of the magnetic field generated on the surface of the magnetic multi-layer thin film structure 1 of the GMR-type or TMR-type angle sensor is less than 300 G, thereby achieving the objectives of providing the capability to measure the angle of a high-amplitude rotational magnetic field and with small nonlinearity error.

A single-package high-field magnetoresistive angle sensor provided by the present invention includes:

at least one push-pull magnetoresistive bridge and a substrate, where the push-pull magnetoresistive bridge includes 2 or 4 magnetoresistive bridge arms, each magnetoresistive bridge arm includes a plurality of magnetoresistive sensor units internally connected to form a two-port structure, the magnetoresistive sensor units are of an MTJ or GMR type, the magnetoresistive sensor units are deposited on the substrate, and all the magnetoresistive bridge arms are electrically connected to form the bridge; the magnetoresistive sensor units each include at least one pinned layer, a ferromagnetic reference layer, a nonmagnetic spacer layer and a ferromagnetic free layer, the intensity of magnetization of the ferromagnetic reference layer of the magnetoresistive sensor unit located on at least one of the magnetoresistive bridge arms of any push-pull magnetoresistive bridge being opposite to the intensity of magnetization of the ferromagnetic reference layer of the rest of the magnetoresistive bridge arms; the ferromagnetic free layer of the magnetoresistive sensor unit is a low aspect ratio oval or circle, which can make the intensity of magnetization of the ferromagnetic free layer align along an external magnetic field in any direction;

and one or more soft magnetic flux attenuators, where the soft magnetic flux attenuator covers the surface of all the magnetoresistive sensor units to attenuate the external magnetic field, and in the angle sensor, electronic elements are connected through a connection welding spot or a through-silicon-via.

As a preferred manner of the present invention, the magnetoresistive angle sensor is provided with at least one push-pull magnetoresistive bridge and includes at least two magnetoresistive sensor unit dice located in a same plane, and the phase of at least one of the magnetoresistive sensor unit dice is flipped by 180 degrees with respect to the rest of the magnetoresistive sensor unit dice in the plane where the dice are located, all the magnetoresistive sensor units located in the same magnetoresistive sensor unit die have the same magnetization direction of the ferromagnetic reference layer, and the magnetoresistive sensor unit dice are electrically connected to form the push-pull magnetoresistive bridge by means of wire bonding.

As a preferred manner of the present invention, the magnetoresistive angle sensor is provided with at least two push-pull magnetoresistive bridges, and the magnetization direction of the ferromagnetic reference layer of at least one of the push-pull magnetoresistive bridges is orthogonal to the magnetization direction of the ferromagnetic reference layer of the rest of the push-pull magnetoresistive bridges; the magnetoresistive angle sensor includes a total of at least four magnetoresistive sensor unit dice located in a same plane, and at least three of the magnetoresistive sensor unit dice are obtained by separately rotating the phases thereof by 90 degrees, 180 degrees and 270 degrees with respect to the rest of the magnetoresistive sensor unit dice in the plane where the dice are located; all the magnetoresistive sensor units located in the same magnetoresistive sensor unit die have the same magnetization direction of the ferromagnetic reference layer, and the magnetoresistive sensor unit dice having the same or opposite magnetization directions of the ferromagnetic reference layer are electrically connected into at least one push-pull magnetoresistive bridge by means of wire bonding.

As a preferred manner of the present invention, at least two push-pull magnetoresistive bridges are provided, the magnetization direction of the ferromagnetic reference layer of at least one of the push-pull magnetoresistive bridges is orthogonal to the magnetization direction of the ferromagnetic reference layer of the rest of the push-pull magnetoresistive bridges; and the magnetoresistive angle sensor includes at least two magnetoresistive sensor unit dice, and the phase of at least one of the magnetoresistive sensor unit dice is flipped by 180 degrees with respect to the rest of the magnetoresistive sensor unit dice in the plane where the dice are located, the magnetoresistive sensor units located in the same magnetoresistive sensor unit die have mutually-orthogonal magnetization directions of the ferromagnetic reference layer, and the dice are electrically connected to form the push-pull magnetoresistive bridge by means of wire bonding.

As a preferred manner of the present invention, at least one push-pull magnetoresistive bridge is provided and is located in the same magnetoresistive sensor unit die, the magnetoresistive sensor units located on the same magnetoresistive bridge arm have the same magnetization direction of the ferromagnetic reference layer, and the ferromagnetic reference layer of at least one of the magnetoresistive bridge arms has an opposite magnetization direction with respect to the ferromagnetic reference layer of the rest of the magnetoresistive bridge arms, and the magnetoresistive bridge arms are internally connected to form the push-pull magnetoresistive bridge.

As another preferred manner of the present invention, at least two push-pull magnetoresistive bridges are provided and are located in the same magnetoresistive sensor unit die, the magnetoresistive sensor units located on the same magnetoresistive bridge arm have the same magnetization direction of the ferromagnetic reference layer, the magnetization direction of the ferromagnetic reference layer of at least one of the push-pull magnetoresistive bridges is orthogonal to the magnetization direction of the ferromagnetic reference layer of the rest of the push-pull magnetoresistive bridges, and in any push-pull magnetoresistive bridge, the ferromagnetic reference layer of at least one of the magnetoresistive bridge arms has an opposite magnetization direction with respect to the ferromagnetic reference layer of the rest of the magnetoresistive bridge arms; the magnetoresistive bridge arms are internally connected to form the push-pull magnetoresistive bridge.

Further, a push magnetoresistive sensor unit and a pull magnetoresistive sensor unit of the push-pull magnetoresistive bridge are both of a single-stack-layer structure which includes an anti-ferromagnetic layer and a ferromagnetic reference layer, and the push magnetoresistive sensor unit and the pull magnetoresistive sensor unit have opposite magnetization directions of the ferromagnetic reference layer; the anti-ferromagnetic layer of the magnetoresistive sensor unit is heated with laser to reach the blocking temperature thereof or higher, then, magnetic fields in opposite directions are separately applied, and the anti-ferromagnetic layer is cooled to room temperature, thereby forming the push magnetoresistive sensor unit and the pull magnetoresistive sensor unit having opposite magnetization directions of the ferromagnetic reference layer.

Further, a push magnetoresistive sensor unit and a pull magnetoresistive sensor unit of the push-pull magnetoresistive bridge employ two different multi-layer thin film deposition structures respectively, i.e., the multi-layer thin film deposition structure includes an anti-ferromagnetic layer, a ferromagnetic layer, a metal spacer layer, a ferromagnetic reference layer, a non-metal spacer layer and a ferromagnetic free layer from bottom to top, or includes an anti-ferromagnetic layer, a ferromagnetic layer, a metal spacer layer, a ferromagnetic layer, a metal spacer layer, a ferromagnetic reference layer, a non-metal spacer layer and a ferromagnetic free layer from bottom to top; then annealing is carried out when the blocking temperature of the anti-ferromagnetic layer is reached, and same-direction external magnetic fields are applied during cooling, thereby obtaining the push magnetoresistive sensor unit and the pull magnetoresistive sensor unit having opposite magnetization directions of the reference layer.

Further, all the magnetoresistive sensor units are of a single-stack-layer structure which includes an anti-ferromagnetic layer and a ferromagnetic reference layer; the anti-ferromagnetic layer of the magnetoresistive sensor unit is heated with laser to reach the blocking temperature thereof or higher, then, two or four external magnetic fields along orthogonal directions are separately applied, and the anti-ferromagnetic layer is cooled to room temperature, thereby forming push arms and pull arms of the orthogonal push-pull magnetoresistive bridges.

Further, in the orthogonal push-pull magnetoresistive bridges, a multi-layer thin film structure of one bridge arm or two bridge arms having opposite magnetization directions of the reference layer corresponding to the push-pull magnetoresistive bridge in one direction includes an anti-ferromagnetic layer 1, a ferromagnetic layer, a metal spacer layer, a ferromagnetic reference layer, a non-metal spacer layer and a ferromagnetic free layer from bottom to top, or includes an anti-ferromagnetic layer 1, a ferromagnetic layer, a metal spacer layer, a ferromagnetic layer, a metal spacer layer, a ferromagnetic reference layer, a non-metal spacer layer and a ferromagnetic free layer from bottom to top;

a multi-layer thin film structure of one bridge arm or two bridge arms having opposite magnetization directions of the reference layer corresponding to another push-pull magnetoresistive bridge orthogonal to the push-pull magnetoresistive bridge includes an anti-ferromagnetic layer 2, a ferromagnetic layer, a metal spacer layer, a ferromagnetic reference layer, a non-metal spacer layer and a ferromagnetic free layer from bottom to top, or includes an anti-ferromagnetic layer 2, a ferromagnetic layer, a metal spacer layer, a ferromagnetic layer, a metal spacer layer, a ferromagnetic reference layer, a non-metal spacer layer and a ferromagnetic free layer from bottom to top; and annealing is carried out when blocking temperatures of the anti-ferromagnetic layer 1 and the anti-ferromagnetic layer 2 are reached, and two external magnetic fields in orthogonal directions are separately applied during cooling, thereby obtaining the push magnetoresistive sensor units and the pull magnetoresistive sensor units of the push-pull magnetoresistive bridges having orthogonal and opposite magnetization directions of the ferromagnetic reference layer.

Specifically, each magnetoresistive sensor unit die corresponds to one soft magnetic flux attenuator, and the soft magnetic flux attenuators are located on the surface of all the magnetoresistive sensor units in the magnetoresistive sensor unit die.

Specifically, each magnetoresistive bridge arm where the magnetoresistive sensor units are located corresponds to one soft magnetic flux attenuator, and the soft magnetic flux attenuators are located on the surface of all the magnetoresistive sensor units on the magnetoresistive bridge arm.

Specifically, each magnetoresistive sensor unit corresponds to one soft magnetic flux attenuator, and the soft magnetic flux attenuator is located on the surface of the magnetoresistive sensor unit.

Specifically, an input end and an output end of the push-pull magnetoresistive bridge are connected to pins on a same lead frame through wires.

Specifically, the lead frame and the push-pull magnetoresistive bridge are sealed in plastics to form a standard semiconductor package.

Specifically, each magnetoresistive sensor unit die is tested and graded before assembly, so that transmission curves of the magnetoresistive sensor unit dice fit each other more desirably.

Specifically, the magnetoresistive sensor units are located in the magnetoresistive sensor unit die, four magnetoresistive sensor unit dice are provided and are arranged around an application specific integrated circuit (ASIC), so that the push-pull magnetoresistive bridges have a common geometric center, and pins of the magnetoresistive sensor unit dice are closely adjacent to each other.

Specifically, the magnetoresistive sensor unit dice are located right above the ASIC, the magnetoresistive sensor unit dice in four rotational phases are arranged in a manner of being rotated by 90 degrees from one another, and a short side of any magnetoresistive sensor unit die is arranged side by side with a long side of the adjacent magnetoresistive sensor unit die.

Further, the ASIC includes an electrostatic discharge (ESD) protection circuit.

Further, the ASIC includes an ESD protection circuit and a processing circuit configured to perform calculation on the outputs of the two push-pull magnetoresistive bridges in orthogonal axial directions, the processing circuit enabling an angle value to be output in a digital form.

DETAILED DESCRIPTION

The present invention will be described in detail with reference to the accompanying drawings in combination with embodiments.

Embodiment 1

Figure 1:
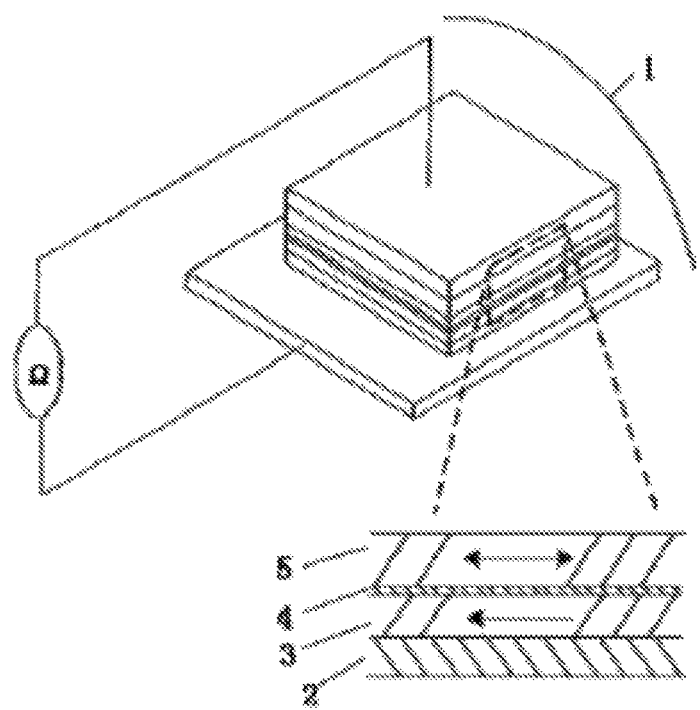
FIG. 1 shows a structure of a TMR or GMR magnetoresistive sensor unit.
Figure 2:
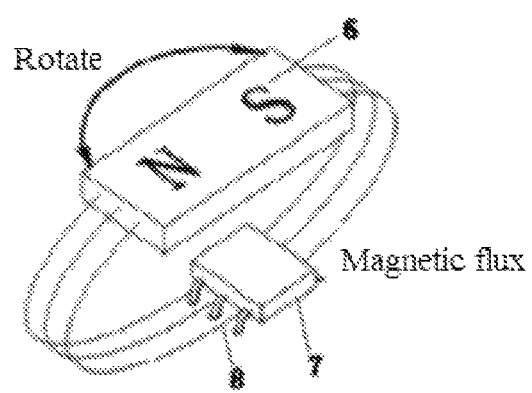
FIG. 2 is a schematic diagram of measurement of an angle of a rotational magnetic field by a magnetoresistive angle sensor.
Figure 3:
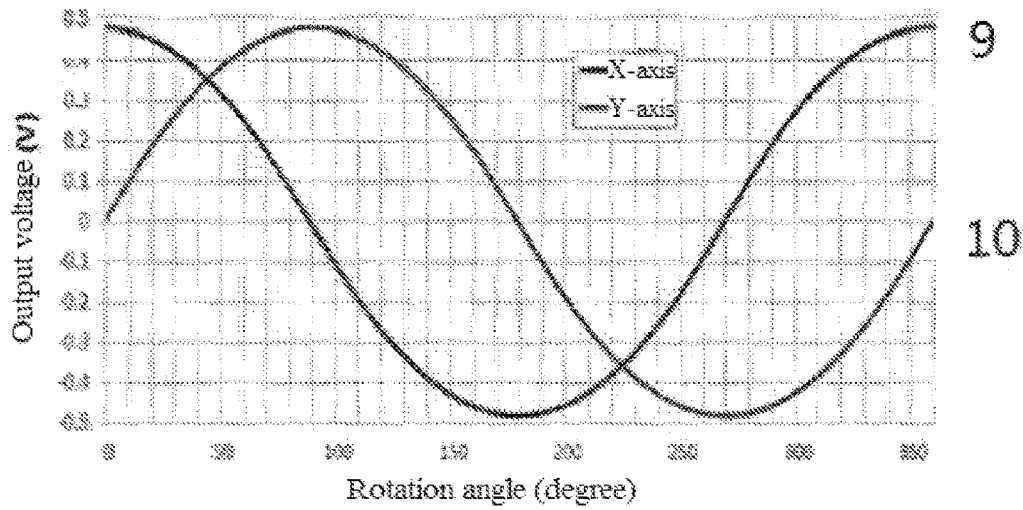
FIG. 3 is a diagram of a signal output of a biaxial magnetoresistive angle sensor.
Figure 4:
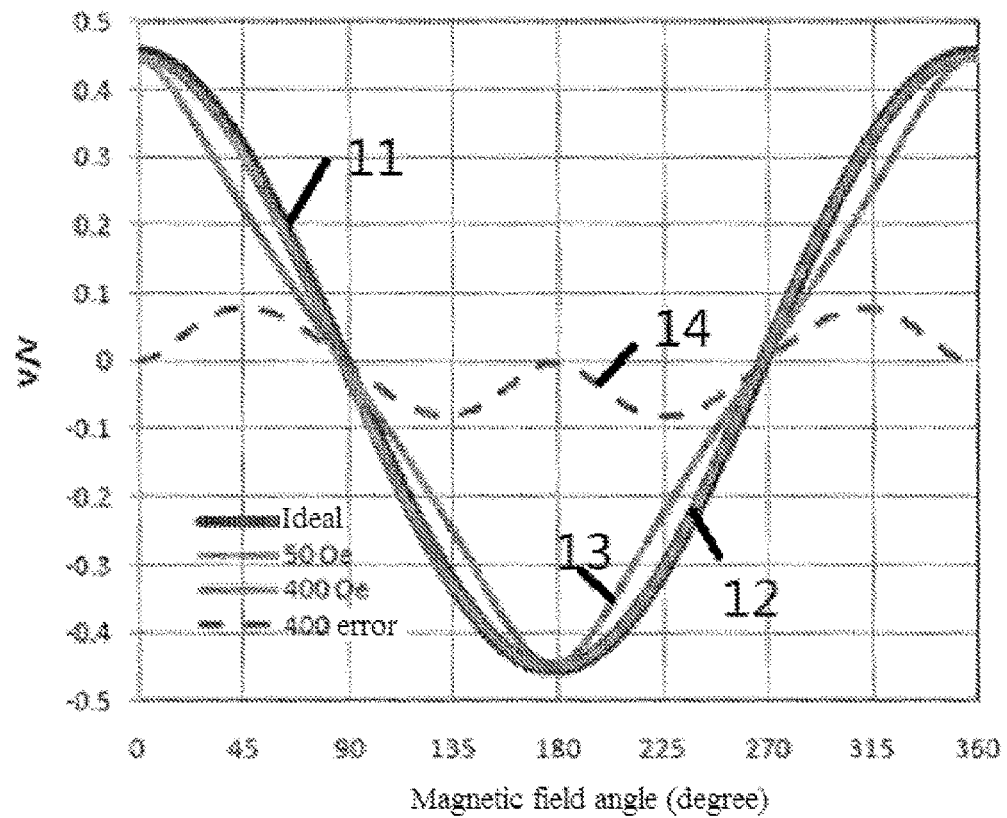
FIG. 4 shows a plot of the signal and measurement errors of a single-axis TMR or GMR magnetoresistive angle sensor for rotational magnetic fields of different amplitudes.
Figure 5:
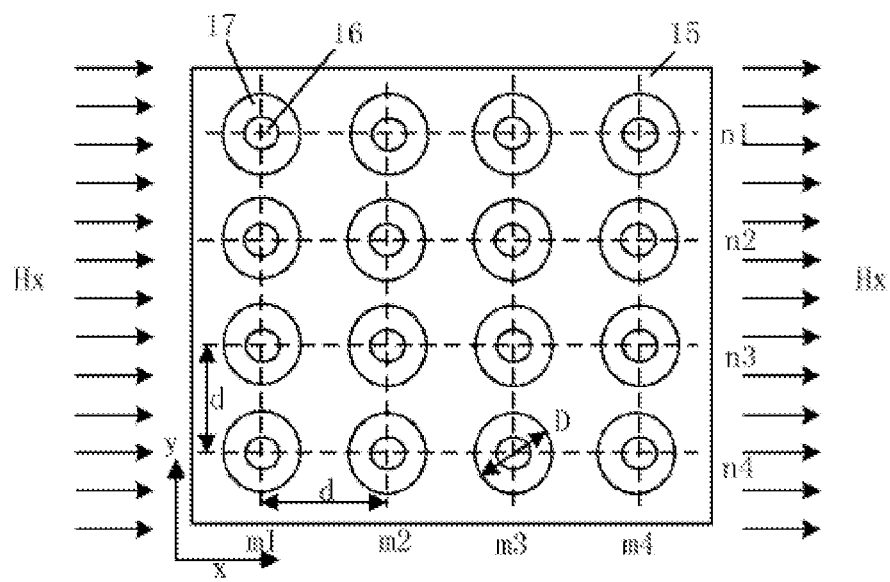
FIG. 5 is a basic structural diagram of a high-field magnetoresistive angle sensor.

FIG. 5 is a schematic diagram of magnetic field attenuation by magnetoresistive sensor units 16 whose surfaces are covered by soft magnetic flux attenuators 17, where 15 represents a substrate, and the GMR or TMR magnetoresistive sensor units 16 and the soft magnetic flux attenuators 17 on the substrate 15 are circular, so as to ensure that uniform rotations can be generated in each direction under the effect of a rotational external magnetic field. The soft magnetic flux attenuator 17 is located on the surface of the GMR or TMR magnetoresistive sensor unit, and is concentric with the GMR or TMR magnetoresistive sensor unit. In this arrangement, the magnetoresistive sensor units 16 and the soft magnetic flux attenuators 17 are arranged into an array structure. A distance between centers of adjacent magnetoresistive sensor units is d, and the diameter of the soft magnetic flux attenuator 17 is D.

Figure 6:
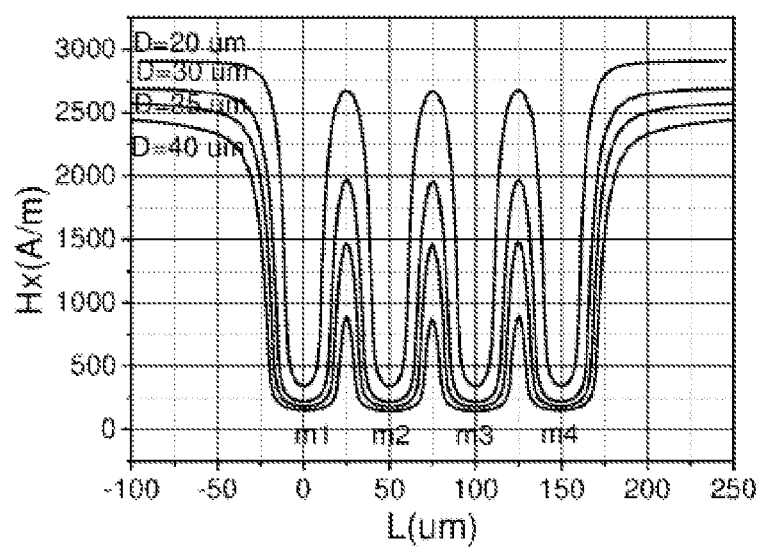
FIG. 6 is a diagram of a measurement principle of a high-field magnetoresistive angle sensor for high intensity external magnetic field.

FIG. 6 is a magnetic field distribution diagram of magnetoresistive sensor units along an X-direction. As can be seen, the amplitudes of the magnetic field at four magnetoresistive sensor units m1, m2, m3 and m4 are significantly reduced compared with the external magnetic field at two ends, and the distribution of the external magnetic field at the four magnetoresistive sensor units is basically the same, indicating desirable uniformity.

Figure 7:
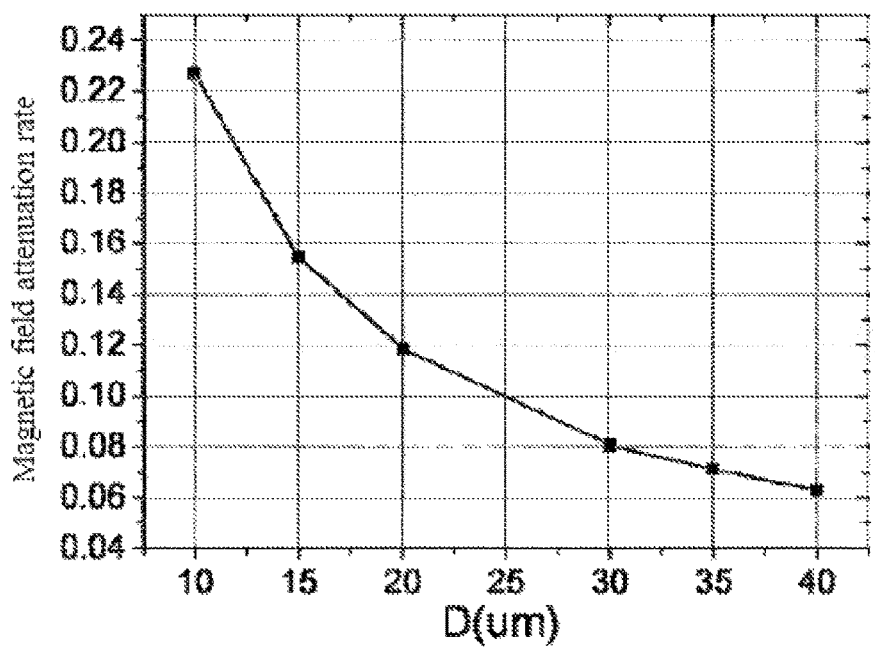
FIG. 7 shows changes in an external magnetic field attenuation rate of a high-field magnetoresistive angle sensor along with changes in the size of a flux attenuator.

FIG. 7 shows changes in an external magnetic field attenuation rate of a soft magnetic flux attenuator along with changes in the size D of the soft magnetic flux attenuator. The magnetic field attenuation rate is defined as a ratio of the magnetic field amplitude at the magnetoresistive sensor unit shown in FIG. 6 to the external magnetic field. It can be seen from FIG. 7 that, as the size D of the soft magnetic flux attenuator increases, the magnetic field attenuation range gradually increases. In addition, it can also be seen from FIG. 6 that, the magnetic field attenuation rate is further related to the size of the magnetoresistive sensor unit, and as the size of the magnetoresistive sensor unit increases, the distribution thereof at the bottom of a magnetic field distribution curve becomes wider, and therefore the average magnetic field amplitude also increases relatively.

It can be seen that, the magnetic field attenuation rate in FIG. 7 is between 0.06 and 0.23, that is, when the magnetic field amplitude on the surface of the magnetoresistive sensor unit is 300 G, a measurement range of the external magnetic field is between 1500 G and 5000 G. Therefore, by means of the magnetic field attenuator, the amplitude range of the rotational magnetic field is significantly increased.

Embodiment 2

Figure 8:
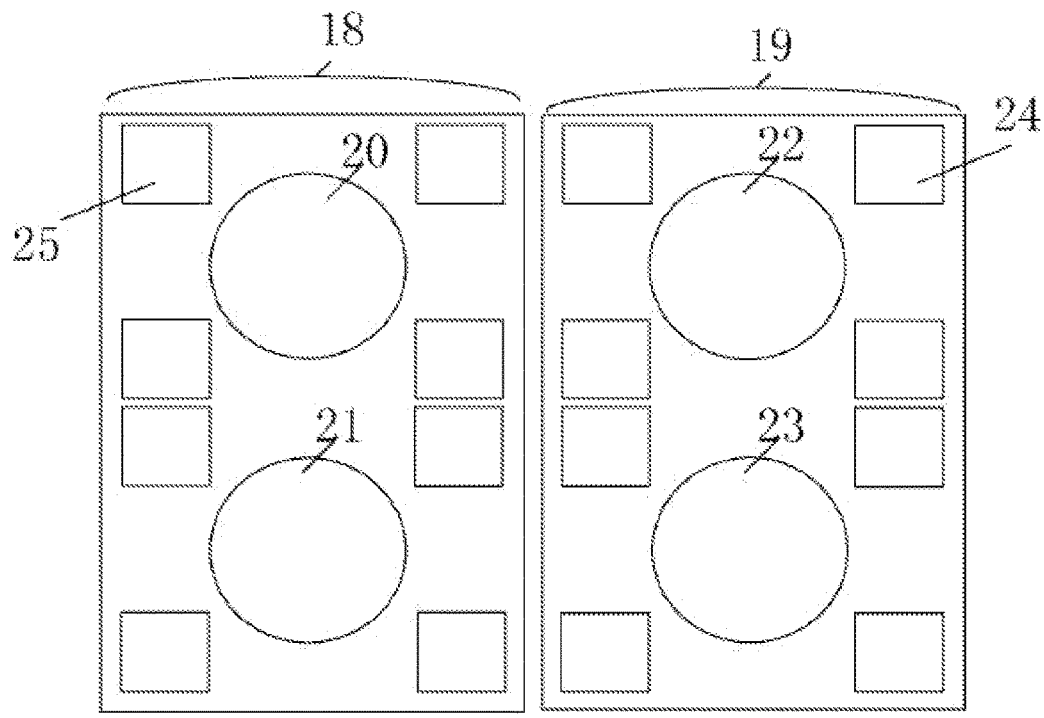
FIG. 8 is a structural schematic diagram of the flipped dice of a high-field magnetoresistive angle sensor.

FIG. 8 is a schematic structural diagram of flipped dice high-field magnetoresistive angle sensor. The high-field magnetoresistive angle sensor includes two dice 18 and 19, and the two dice have identical structures. One die is rotated by 180 degrees with respect to the other die. Each die includes two soft magnetic flux attenuators, magnetoresistive sensor units 20 and 1, 22 and 23 covered by the two soft magnetic flux attenuators, and pins 25 and 24 on the periphery. Because the two dice are rotated by 180 degrees with respect to each other, ferromagnetic reference layers of the magnetoresistive sensor units thereof have opposite magnetization directions, so that a push-pull bridge structure can be formed. The two dice are connected by using a wire.

Figure 9:
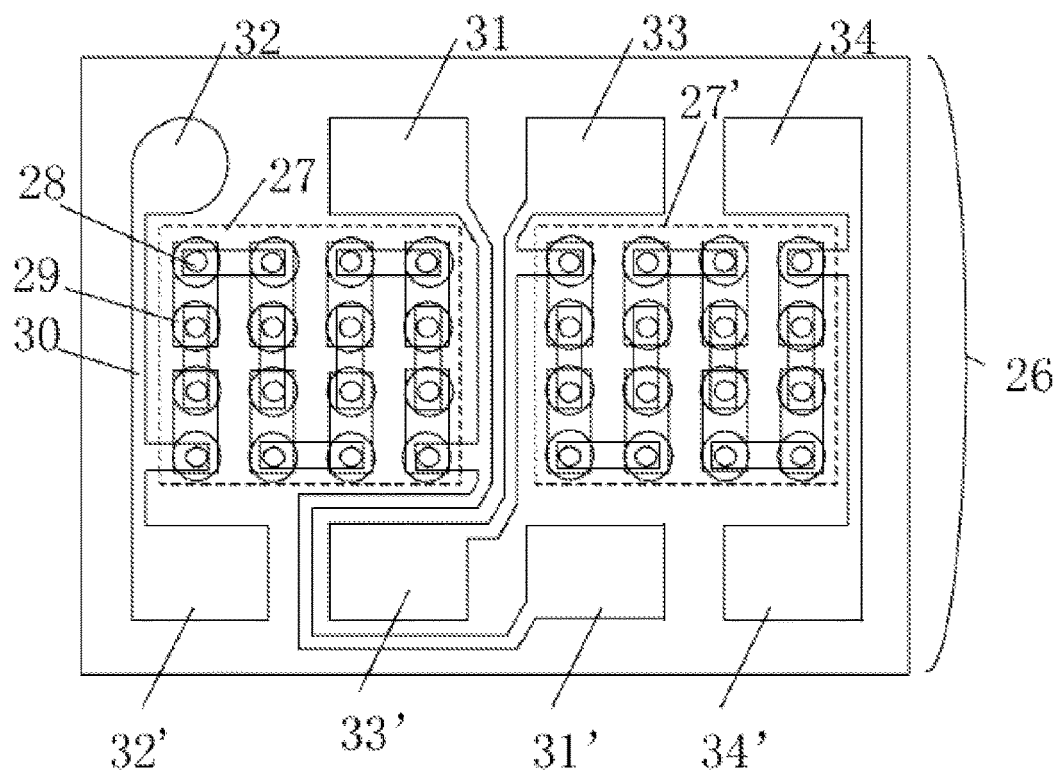
FIG. 9 is a structural diagram of a die of a high-field magnetoresistive angle sensor.

FIG. 9 is a structural diagram of a single die 26, which includes two sensing range 27 and 27' formed by two array-type magnetoresistive sensor units 28 and soft magnetic flux attenuators 29 covering the surface of the magnetoresistive sensor units 28. Magnetoresistive sensor units in either of the sensing ranges are connected in series to form a two-port structure, and are connected to pins through a wire 30. Pins 31 and 32 are located at two ends of one sensing range, and pins 33 and 34 are located at two ends of the other sensing range. To facilitate wire connection, each port further includes two bond pads: an upper bond pad and a lower bond pad, i.e., 32 and 32', 31 and 31', 33 and 33', as well as 34 and 34', where the bond pads 31' and 33' are intertwined, to facilitate cross connection between wires.

Figure 10:
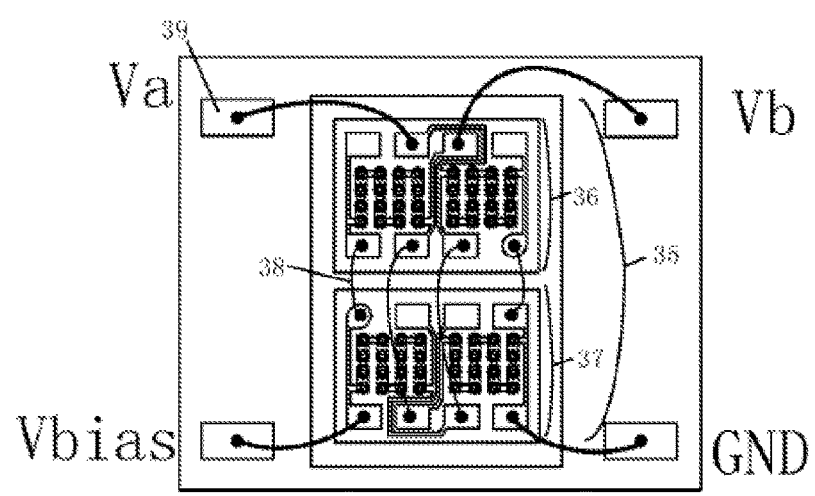
FIG. 10 is a structural diagram of the single-axis flipped dice of a high-field magnetoresistive angle sensor.
Figure 11:
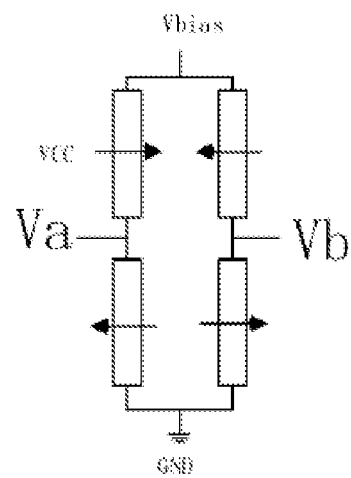
FIG. 11 is a structural diagram of a push-pull full bridge of a high-field magnetoresistive angle sensor with single-axis flipped dice.

FIG. 10 is a schematic structural diagram of a single-axis flipped die 35 high-field magnetoresistive angle sensor. Two dice 36 and 37 are arranged in a manner of rotating one die by 180 degrees with respect to the other die, and are connected through a wire 38, and finally output signals to four bond pads 39. The four bond pads include a power supply Vbias, a ground bond pad, and two signal output ends. The connection manner is a push-pull full bridge structure as shown in FIG. 11, and in fact, there may also be a half-bridge structure and a quasi-bridge structure.

Figure 12:
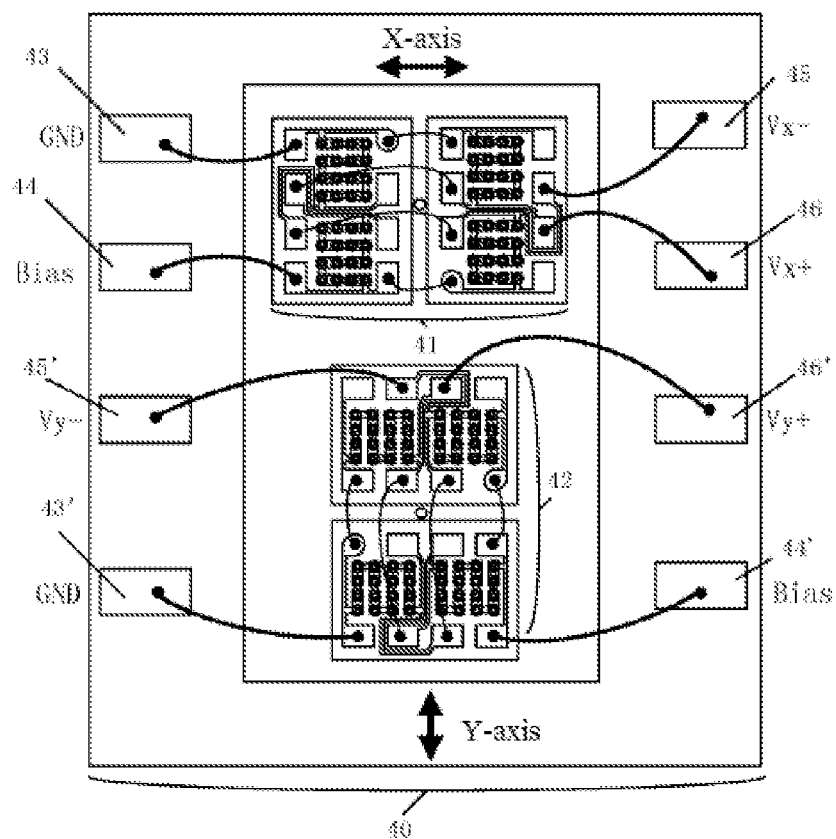
FIG. 12 is a structural diagram of the biaxial flipped dice of a high-field magnetoresistive angle sensor.
Figure 13:
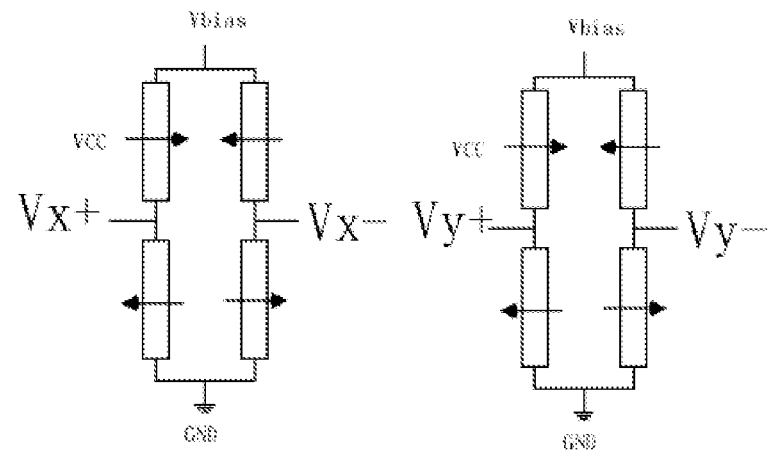
FIG. 13 is a schematic diagram of a push-pull full bridge of a biaxial high-field magnetoresistive angle sensor.

FIG. 12 is a schematic structural diagram of a biaxial flipped die 40 high-field magnetoresistive angle sensor, which includes an X-axis single-axis flipped die 41 and a Y-axis single-axis flipped die 42 orthogonal to each other, and the Y-axis single-axis flipped die 42 is obtained by rotating the X-axis single-axis flipped die by 90 degrees. Moreover, in terms of positions, the X-axis single-axis flipped die 41 and the Y-axis single-axis flipped die 42 are separately disposed. In addition, the biaxial flipped die 40 further includes power supply bond pads 44 and 44', ground bond pads 43 and 43', positive signal output ends 46 and 46', and negative signal output ends 45 and 45' corresponding to the X-axis single-axis flipped die 41 and the Y-axis single-axis flipped die 42 respectively. Two X-axis and Y-axis push-pull full bridge structures corresponding to FIG. 12 are as shown in FIG. 13.

Figure 14:
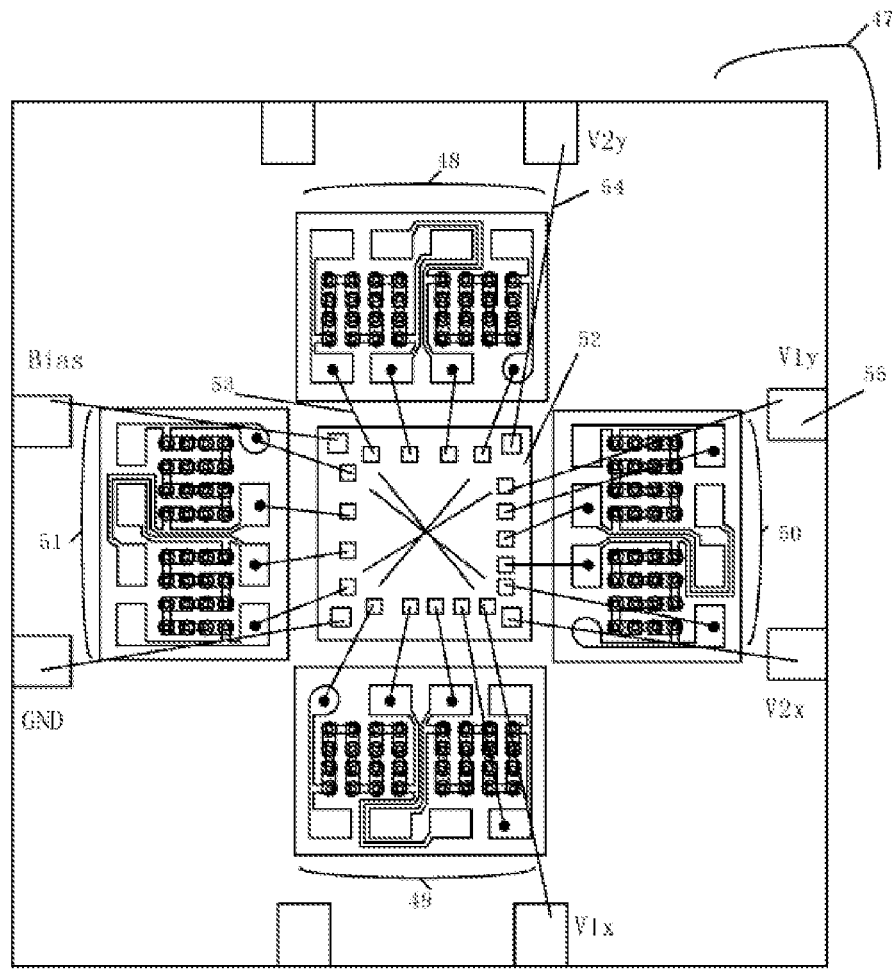
FIG. 14 is a first structural diagram of a biaxial flipped die high-field magnetoresistive angle sensor.

FIG. 14 is a schematic structural diagram of another biaxial flipped die 47 high-field magnetoresistive angle sensor, which includes an ASIC unit 52, two single-axis flipped dice 48 and 49 corresponding to the X-axis and two single-axis flipped dice 50 and 51 corresponding to the Y-axis. The two X-axis single-axis flipped dice 48 and 49 are symmetric along the X direction and are located out of two opposite edges of the ASIC unit. The two Y-axis single-axis flipped dice 50 and 51 are symmetric along the Y-axis direction and are located near the other two opposite edges of the ASIC unit. Moreover, the dice are separately connected to the ASIC unit die 52 through wires 53, and then the ASIC unit die 52 is connected to bond pads 55 through wires 54. Because the dice are symmetrically distributed about a geometric center, the problem of output signal deviation caused by the uneven distribution of the magnetic field in FIG. 13 can be eliminated.

Figure 15:
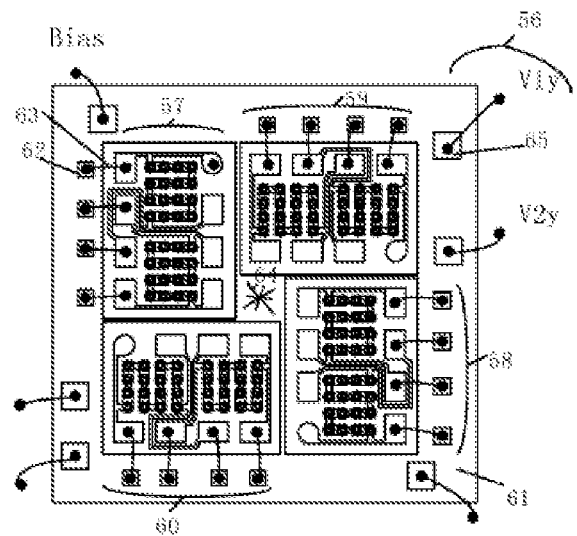
FIG. 15 is a second structural diagram of a biaxial flipped die high-field magnetoresistive angle sensor.

FIG. 15 is a schematic structural diagram of a biaxial flipped die 56 of a second type of high-field magnetoresistive angle sensor. Two single-axis flipped dice 59 and 60 corresponding to the X-axis and two single-axis flipped dice 57 and 58 corresponding to the Y-axis are separately located right above an ASIC unit die 61. The magnetoresistive sensor unit dice in four rotational phases are arranged in a manner of being rotated by 90 degrees from one another, and a short side of any magnetoresistive sensor unit die is arranged side by side with a long side of the adjacent magnetoresistive sensor unit die. The magnetoresistive sensor unit dice are connected to pins 62 on the ASIC unit die 61 through wires 63, and are finally connected to the power supply bond pad, ground bond pad, and signal output bond pads 65 of the ASIC unit die 61 through wires 64 provided on the ASIC unit die 61.

Embodiment 3

Figure 16:
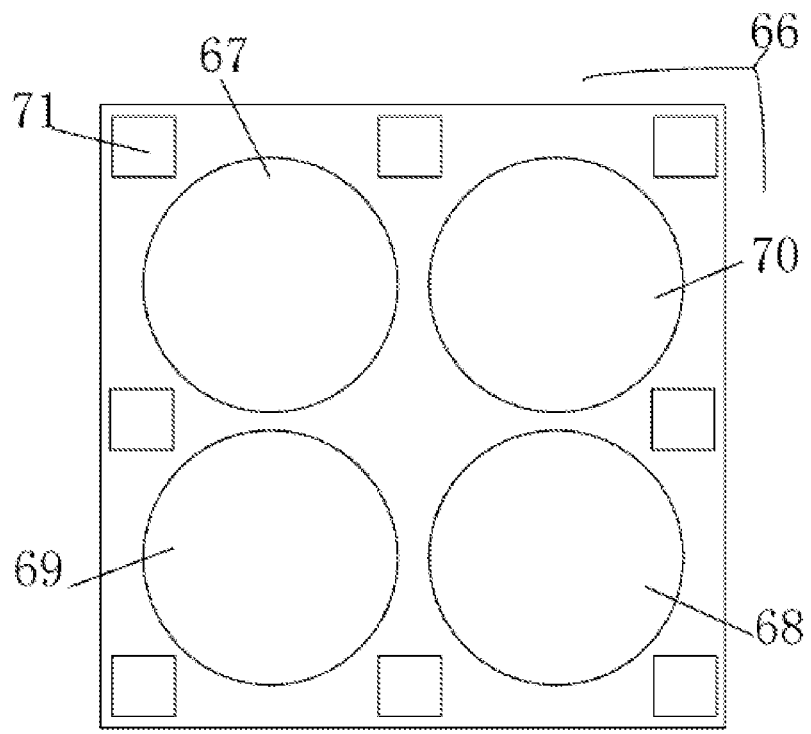
FIG. 16 is a structural diagram of a single-axis single chip high-field magnetoresistive angle sensor.

FIG. 16 is a schematic structural diagram of a single-axis single chip 66 high-field magnetoresistive angle sensor, where 67 corresponds to magnetoresistive sensor units of two push arms of the push-pull magnetoresistive sensor, 68 corresponds to soft magnetic flux attenuators of two push arms of the push-pull magnetoresistive sensor, 69 corresponds to magnetoresistive sensor units of two pull arm, and 70 corresponds to soft magnetic flux attenuators. The push arms and pull arms have opposite magnetization directions of the ferromagnetic reference layer, and are located on a same die; 71 represents bond pads.

Figure 17:
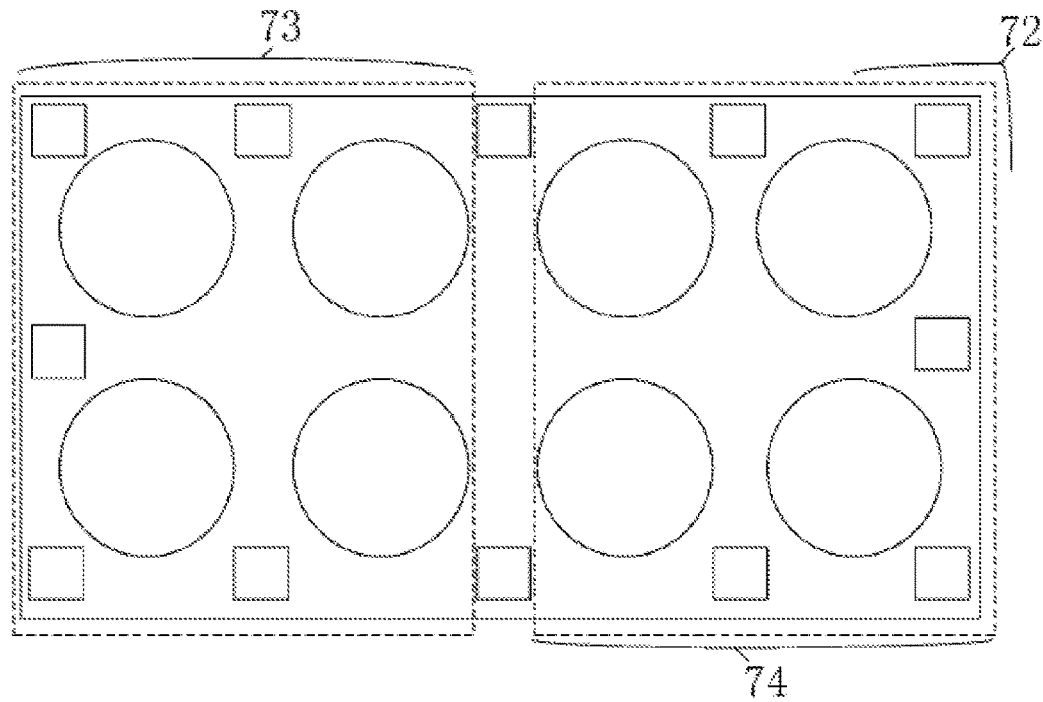
FIG. 17 is a structural diagram of a biaxial single chip high-field magnetoresistive angle sensor.

FIG. 17 is a schematic structural diagram of a biaxial single chip 72 high-field magnetoresistive angle sensor, where an X-axis magnetoresistive angle sensor 73 and a Y-axis magnetoresistive angle sensor 74 are located on a same die. Ferromagnetic magnetization directions of the reference layer of the X-axis magnetoresistive angle sensor 73 are X and −X directions, and magnetization directions of the ferromagnetic reference layer of the Y-axis magnetoresistive angle sensor 74 are Y and −Y directions.

Figure 18:
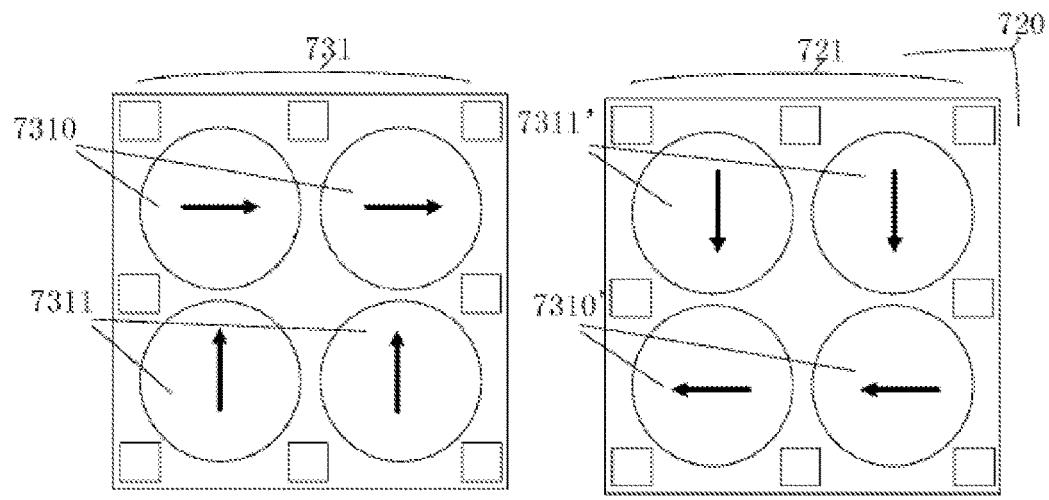
FIG. 18 is a structural diagram of a biaxial single flipped die high-field magnetoresistive angle sensor.

FIG. 18 is a schematic structural diagram of a biaxial single flipped die 720 high-field magnetoresistive angle sensor. A die 731 includes two groups of magnetoresistive sensor units 7310 and 7311 having orthogonal magnetization directions of the ferromagnetic reference layer, and a die 721 may be obtained by rotating the phase of the die 731 by 180 degrees in the plane where the dice are located. Dice 7311' and 7310' have a magnetization direction of the ferromagnetic reference layer opposite to that of the dice 7310 and 7311, 7310 and 7310' form a push-pull magnetoresistive sensor unit bridge in one direction, and 7311 and 7311' form a push-pull magnetoresistive sensor unit bridge in an orthogonal direction. The two dice 731 and 721 are connected by means of wire bonding.

Figure 19:
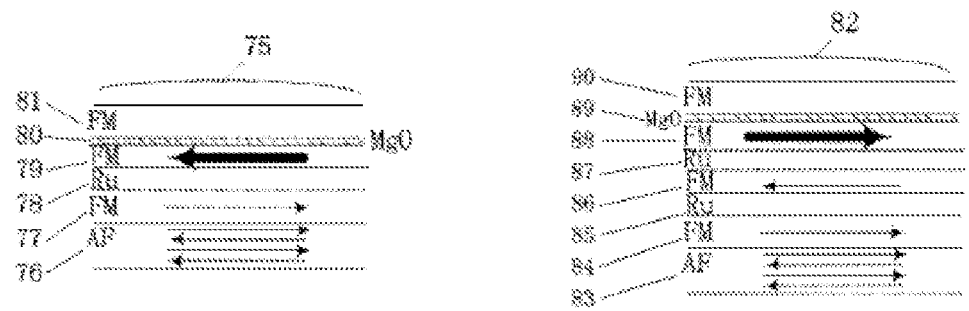
FIG. 19 is a diagram of magnetic multi-layer thin film structures of a push arm and a pull arm of a high-field magnetoresistive angle sensor with a single-axis single-chip structure.

FIG. 19 is an implementation, on a same chip, of magnetic multi-layer thin film structures having opposite magnetization directions of the reference layer corresponding to a push arm and a pull arm of a structure of a single-axis single chip 66 corresponding to a high-field magnetoresistive angle sensor. 75 corresponds to the magnetic multi-layer thin film structure of the push arm, 82 corresponds to the magnetic multi-layer thin film structure of the pull arm, and the two structures each include an anti-ferromagnetic layer 76 and 83, a ferromagnetic layer 77 and 84, 86, a metal layer 78 and 85, 87, a non-magnetic spacer layer 80 and 89, a ferromagnetic reference layer 79 and 88, and a free layer 81 and 90. The difference lies in that the magnetic multi-layer thin film corresponding to the push arm with the multi-layer thin film structure 75 and the magnetic multi-layer thin film corresponding to the pull arm with the multi-layer thin film structure 76 have different deposition sequences. The anti-ferromagnetic layers 76 and 83 have the same magnetization state, and have the same magnetization direction as the adjacent ferromagnetic layers 77 and 84 thereof. The ferromagnetic reference layer 79 and the ferromagnetic layer 77 have opposite magnetization directions by means of a coupling exchange effect of the metal layer 77. Therefore, the ferromagnetic reference layer in 75 is opposite and parallel to the ferromagnetic layer 77, and the ferromagnetic layer 86 in 82 is also opposite and parallel to the direction of the ferromagnetic layer 83. Similarly, another metal layer 87 is introduced between the ferromagnetic reference layer 88 and the ferromagnetic layer 86 in 82, thus causing the ferromagnetic reference layer 88 to have the same magnetization direction as the ferromagnetic layer 84. Finally, the magnetic multi-layer thin film structure 75 of the push arm and the magnetic multi-layer thin film structure 82 of the pull arm have opposite magnetization directions of the ferromagnetic reference layer. During actual deposition, in addition to that the magnetic multi-layer thin films of the push arm and the pull arm have different deposition sequences, the anti-ferromagnetic layers are the same and have the same magnetization state; therefore, there is only one magnetic annealing process.

Figure 20:
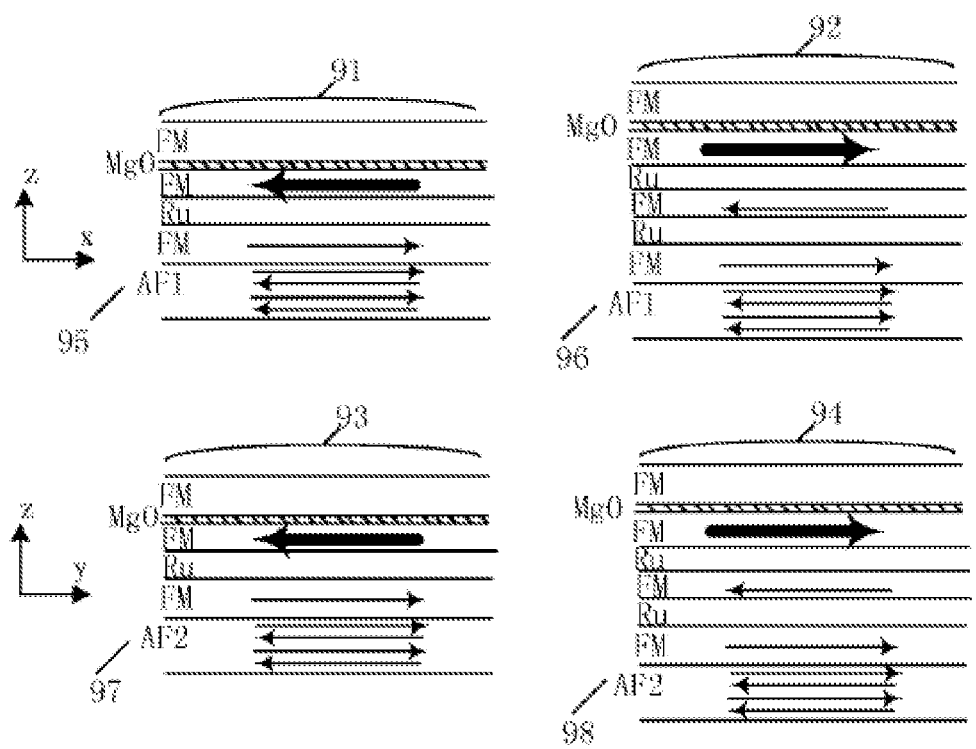
FIG. 20 is a diagram of magnetic multi-layer thin film structures of a push arm and a pull arm corresponding to the X-axis and Y-axis of a high-field magnetoresistive angle sensor with a biaxial single-chip structure.

FIG. 20 shows four different magnetic multi-layer thin film structures, which are located on the same chip, of a push arm and a pull arm of an X-axis magnetoresistive angle sensor 73 as well as a push arm and a pull arm of a Y-axis magnetoresistive angle sensor 74 corresponding to the structure of a biaxial single chip 72 high-field magnetoresistive angle sensor. 91 corresponds to the magnetic multi-layer thin film structure of the push arm of the X-axis magnetoresistive angle sensor, and 92 corresponds to the magnetic multi-layer thin film structure of the pull arm of the X-axis magnetoresistive angle sensor, where the magnetization directions of anti-ferromagnetic layers AF1 95 and 96 and the magnetization direction of the reference ferromagnetic layer are along a X direction or a −X direction. The magnetic multi-layer thin film structure 93 corresponds to the push arm of the Y-axis magnetoresistive angle sensor, and 94 corresponds to the magnetic multi-layer thin film structure of the pull arm of the Y-axis magnetoresistive angle sensor, where the magnetization directions of anti-ferromagnetic layers AF2 97 and 98 and the magnetization direction of the reference ferromagnetic layer are along a Y direction or a −Y direction. The sequence of the multi-layer thin films of the push arm and pull arm thereof are similar to that in FIG. 18. In this way, two different types of anti-ferromagnetic layers AF1 and AF2 need to be deposited on a same chip, and each type of anti-ferromagnetic layer includes two different multi-layer thin film deposition sequences. Besides, two different magnetic field annealing temperatures and two different annealing magnetic field directions are needed for AF1 and AF2. Assuming that blocking temperatures of one of AF1 and AF2 are Tb1 and Tb2, where Tb1>Tb2, during magnetic field annealing, magnetic field annealing is first carried out at Tb1 to obtain the X-axis magnetic field direction, and then magnetic field annealing is carried out at Tb2 to obtain the Y-axis magnetic field direction.

Figure 21:
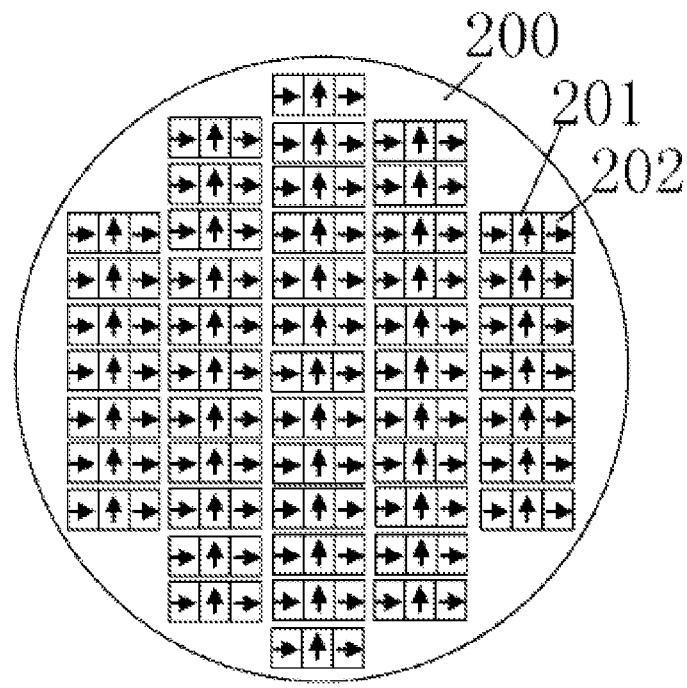
FIG. 21 is a diagram of distribution, on a wafer, of magnetoresistive sensor units on a push arm and a pull arm in the X-axis and Y-axis of a high-field magnetoresistive angle sensor with a biaxial single-flipped-die structure.

FIG. 21 is a diagram of the distribution, on a wafer 200, of an X-axis and a Y-axis magnetoresistive sensor unit having different directions corresponding to the structure of a biaxial single flipped die 720 high-field magnetoresistive angle sensor. In order to guarantee uniformity of the distribution on the wafer, it is necessary to enable various multi-layer thin film units having ferromagnetic reference layers along different directions to be distributed in different areas. In the figure, 201 represents anti-ferromagnetic layers along the Y-axis, 202 represents anti-ferromagnetic layers along the X-axis, and the anti-ferromagnetic layers are distributed in different areas on the wafer 200. By depositing different ferromagnetic layers and metal layers in different sequences on the anti-ferromagnetic layer, directions along the orthogonal X-axis and Y-axis are determined. In different areas, patterning of tunnel junction units needs to be carried out at the same time after the sequences and directions of all the deposited multi-layer thin films are determined.

Figure 22:
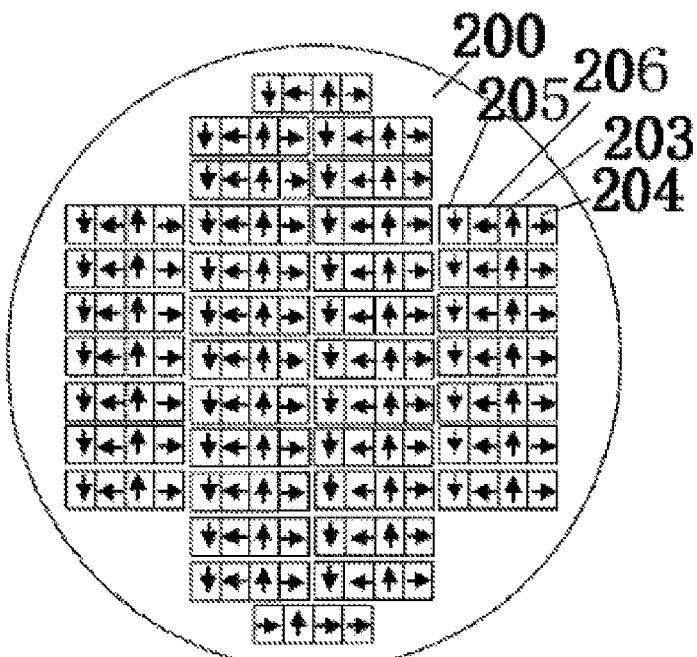
FIG. 22 is a diagram of distribution, on a wafer, of magnetoresistive sensor units on a push arm and a pull arm in the X-axis and Y-axis of a high-field magnetoresistive angle sensor with a biaxial single-chip structure.

FIG. 22 is a diagram of distribution, on a wafer 200, of an X-axis and a Y-axis magnetoresistive sensor unit having different directions corresponding to the structure of a biaxial single chip 72 high-field magnetoresistive angle sensor. In order to guarantee uniformity of the distribution on the wafer, it is necessary to enable various multi-layer thin film units having reference ferromagnetic layers along different directions to be distributed in different areas. In the figure, 203 and 205 respectively represent anti-ferromagnetic layers along the Y-axis, 204 and 206 represent anti-ferromagnetic layers along the X-axis, and the anti-ferromagnetic layers are distributed in different areas on the wafer 200. Then, different ferromagnetic layers and metal layers are deposited in different sequences on the anti-ferromagnetic layer, to determine directions along the positive X-axis, negative X-axis, positive Y-axis and negative Y-axis. In different areas, patterning of tunnel junction units needs to be carried out at the same time after the sequences and directions of all the deposited multi-layer thin films are determined.

Figure 23:
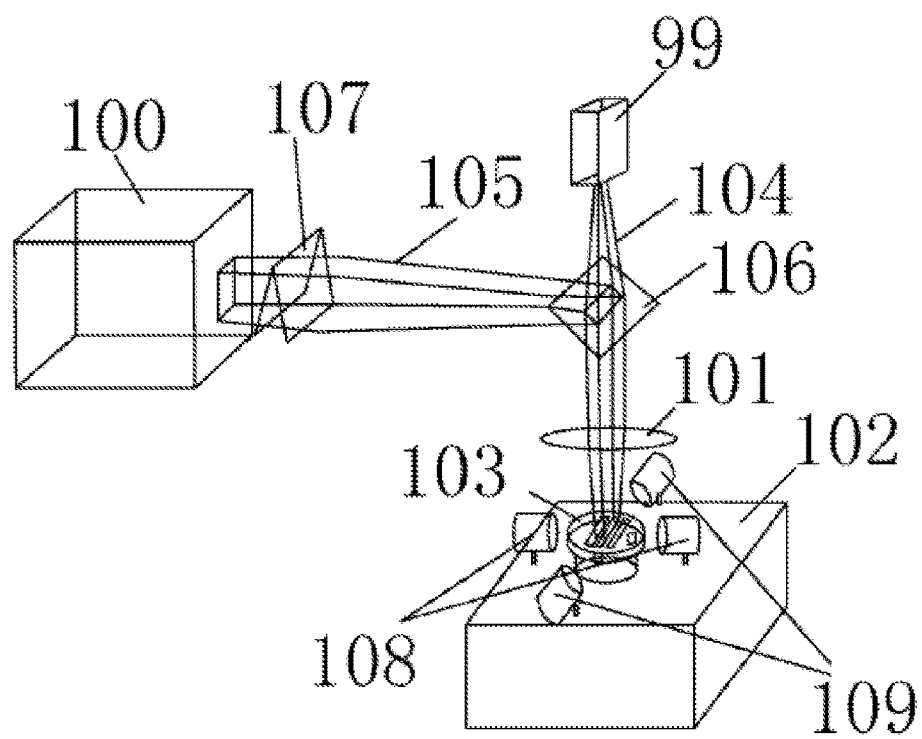
FIG. 23 is a laser auxiliary thermal annealing device for magnetic multi-layer thin films of a push arm and a pull arm of a high-field magnetoresistive angle sensor with a single-chip structure.

FIG. 23 is a laser-heating auxiliary annealing device for magnetic multi-layer thin film structures with different ferromagnetic reference layer directions of a plush arm and a pull arm of a magnetoresistive angle sensor corresponding to a single-axis single chip structure 66 and the structure of a biaxial single chip 72 high-field magnetoresistive angle sensor. The device includes: a laser source 100 configured to emit a laser beam 105 aligned with the magnetic thin film 103; an optical attenuator 107 disposed at a rear end of the laser beam 105 emitted by the laser source 100; a reflector 106 configured to change a propagation direction of the laser beam 105 attenuated by the optical attenuator 107; a focusing objective lens 101 configured to focus the laser beam 105 whose direction has been changed by the reflector 106, to form a spot; a movable platform 102 which includes a fixture for gripping the magnetic thin film 103; and two electromagnets 108 and 109 orthogonal to each other. In addition, the device further includes a CCD camera 99. The reflector 106 is provided with a slit, and the CCD camera 99 adjusts the reflector 106 through the slit of the reflector 106, so as to align the spot with the magnetic thin film 103, where 104 is light entering the CCD camera 99.

By means of the laser auxiliary thermal annealing device shown in FIG. 23, through the movement of the movable platform 102, the laser spot directly selects magnetoresistive sensor units corresponding to the push arm and pull arm on the magnetic multi-layer thin film, and directly heats the anti-ferromagnetic layer to its blocking temperature or higher. Then, in a cooling process, the electromagnets 108 and 109 along two directions are started, thereby directly determining the magnetization direction of each magnetoresistive sensor unit. In this way, a push magnetoresistive sensor unit and a pull magnetoresistive sensor unit corresponding to a single-axis magnetoresistive angle sensor, and push magnetoresistive sensor units and pull magnetoresistive sensor units of a biaxial magnetoresistive angle sensor in X and Y directions can be directly obtained. Therefore, by means of the laser auxiliary thermal annealing device, the magnetic multi-layer thin films deposited on a single chip have the same deposition sequence.

Figure 24:
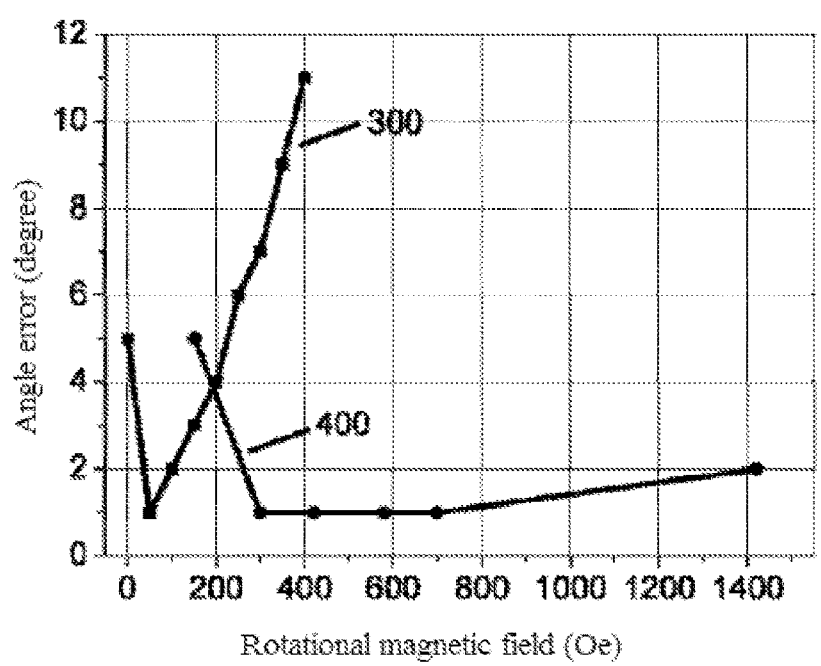
FIG. 24 is a variation chart of angle errors of a high-field magnetoresistive angle sensor and a magnetoresistive angle sensor vs. the amplitude of a rotational magnetic field.

FIG. 24 is a comparison diagram of an angle error of a high-field magnetoresistive angle sensor provided in the present invention vs. an angle error of a magnetoresistive angle sensor without a magnetic flux attenuator, where 300 represents an error curve of the magnetoresistive angle sensor without a magnetic flux attenuator. It can be seen that, the angle error range thereof may reach 10 to 12 degrees when the magnetic field exceeds 400 Oe, while the high-field magnetoresistive angle sensor of the present invention only has an error of less than 2 degrees when the magnetic field is 1400 Oe. The performance is significantly improved.

Described above are merely preferred embodiments of the present invention, which are not intended to limit the present invention. For those skilled in the art, the present invention may have various alterations and changes. Embodiments in the present invention may also be combined in different manners. Any modification, equivalent replacement, and improvement made within the spirit and principle of the present invention shall be included in the protection scope of the present invention.

The invention claimed is:

1. A single-package high-field magnetoresistive angle sensor, comprising:
   at least one push-pull magnetoresistive bridge and a substrate,
      wherein the push-pull magnetoresistive bridge comprises 2 or 4 magnetoresistive bridge arms, wherein each magnetoresistive bridge arm comprises a plurality of magnetoresistive sensor units internally connected to form a two-port structure, wherein the magnetoresistive sensor units are of an MTJ or GMR type and are deposited on the substrate, and wherein all the magnetoresistive bridge arms are electrically connected to form the bridge;
      wherein the magnetoresistive sensor unit comprises at least one pinned layer, a ferromagnetic reference layer, a nonmagnetic spacer layer and a ferromagnetic free layer, wherein the intensity of magnetization of the ferromagnetic reference layer of the magnetoresistive sensor unit located on at least one of the magnetoresistive bridge arms of any push-pull magnetoresistive bridge being opposite to the intensity of magnetization of the ferromagnetic reference layer of the rest of the magnetoresistive bridge arms; and
      wherein the ferromagnetic free layer of the magnetoresistive sensor unit is a low aspect ratio oval or circle, which can make the intensity of magnetization of the ferromagnetic free layer align along an external magnetic field in any direction; and one or more soft magnetic flux attenuators,
      wherein the soft magnetic flux attenuator covers the surface of all the magnetoresistive sensor units to attenuate the external magnetic field, and in the angle sensor, electronic elements are connected through a bond pad or a through-silicon-via.

2. The single-package high-field magnetoresistive angle sensor according to claim 1,
   wherein the magnetoresistive angle sensor is provided with at least one push-pull magnetoresistive bridge and comprises at least two magnetoresistive sensor unit dice located in a same plane, and the phase of at least one of the magnetoresistive sensor unit dice is flipped by 180 degrees with respect to the rest of the magnetoresistive sensor unit dice in the plane where the dice are located,
   wherein all the magnetoresistive sensor units located in the same magnetoresistive sensor unit die have the same magnetization direction of the ferromagnetic reference layer, and
   wherein the magnetoresistive sensor unit dice are electrically connected to form the push-pull magnetoresistive bridge by means of wire bonding.

3. The single-package high-field magnetoresistive angle sensor according to claim 1,
   wherein the magnetoresistive angle sensor is provided with at least two push-pull magnetoresistive bridges, and the magnetization direction of the ferromagnetic reference layer of at least one of the push-pull magnetoresistive bridges is orthogonal to the magnetization direction of the ferromagnetic reference layer of the rest of the push-pull magnetoresistive bridges;

wherein the magnetoresistive angle sensor comprises a total of at least four magnetoresistive sensor unit dice located in a same plane, and at least three of the magnetoresistive sensor unit dice are obtained by separately rotating the phases thereof by 90 degrees, 180 degrees and 270 degrees with respect to the rest of the magnetoresistive sensor unit dice in the plane where the dice are located; and wherein all the magnetoresistive sensor units located in the same magnetoresistive sensor unit die have the same magnetization direction of the ferromagnetic reference layer, and the magnetoresistive sensor unit dice having the same or opposite magnetization directions of the ferromagnetic reference layer are electrically connected into at least one of the push-pull magnetoresistive bridge by means of wire bonding.

4. The single-package high-field magnetoresistive angle sensor according to claim 1, wherein at least two push-pull magnetoresistive bridges are provided, and the magnetization direction of the ferromagnetic reference layer of at least one of the push-pull magnetoresistive bridges is orthogonal to the magnetization direction of the ferromagnetic reference layer of the rest of the push-pull magnetoresistive bridges;

wherein the magnetoresistive angle sensor comprises at least two magnetoresistive sensor unit dice, the phase of at least one of the magnetoresistive sensor unit dice is flipped by 180 degrees with respect to the rest of the magnetoresistive sensor unit dice in the plane where the dice are located, the magnetoresistive sensor units located in the same magnetoresistive sensor unit die have mutually-orthogonal magnetization directions of the ferromagnetic reference layer, and the dice are electrically connected to form the push-pull magnetoresistive bridge by means of wire bonding.

5. The single-package high-field magnetoresistive angle sensor according to claim 1, wherein at least one push-pull magnetoresistive bridge is provided and is located in the same magnetoresistive sensor unit die, the magnetoresistive sensor units located on the same magnetoresistive bridge arm have the same magnetization direction of the ferromagnetic reference layer, and the ferromagnetic reference layer of at least one of the magnetoresistive bridge arms has an opposite magnetization direction with respect to the ferromagnetic reference layer of the rest of the magnetoresistive bridge arms, and the magnetoresistive bridge arms are internally connected to form the push-pull magnetoresistive bridge.

6. The single-package high-field magnetoresistive angle sensor according to claim 1, wherein at least two push-pull magnetoresistive bridges are provided and are located in the same magnetoresistive sensor unit die, the magnetoresistive sensor units located on the same magnetoresistive bridge arm have the same magnetization direction of the ferromagnetic reference layer, the magnetization direction of the ferromagnetic reference layer of at least one of the push-pull magnetoresistive bridges is orthogonal to the magnetization direction of the ferromagnetic reference layer of the rest of the push-pull magnetoresistive bridges, and in any push-pull magnetoresistive bridge, the ferromagnetic reference layer of at least one of the magnetoresistive bridge arms has an opposite magnetization direction with respect to the ferromagnetic reference layer of the rest of the magnetoresistive bridge arms; and wherein the magnetoresistive bridge arms are internally connected to form the push-pull magnetoresistive bridge.

7. The single-package high-field magnetoresistive angle sensor according to claim 5, wherein a push magnetoresistive sensor unit and a pull magnetoresistive sensor unit of the push-pull magnetoresistive bridge are both of a single-stack-layer structure which comprises an anti-ferromagnetic layer and a ferromagnetic reference layer, and the push magnetoresistive sensor unit and the pull magnetoresistive sensor unit have opposite magnetization directions of the ferromagnetic reference layer; and wherein the anti-ferromagnetic layer of the magnetoresistive sensor unit is heated with laser to reach the blocking temperature thereof or higher, then magnetic fields in opposite directions are separately applied, and the anti-ferromagnetic layer is cooled to room temperature, thereby forming the push magnetoresistive sensor unit and the pull magnetoresistive sensor unit having opposite magnetization directions of the ferromagnetic reference layer.

8. The single-package high-field magnetoresistive angle sensor according to claim 5, wherein a push magnetoresistive sensor unit and a pull magnetoresistive sensor unit of the push-pull magnetoresistive bridge employ two different multi-layer thin film deposition structures respectively, wherein the multi-layer thin film deposition structure comprises an anti-ferromagnetic layer, a ferromagnetic layer, a metal spacer layer, a ferromagnetic reference layer, a non-metal spacer layer and a ferromagnetic free layer from bottom to top, or comprises an anti-ferromagnetic layer, a ferromagnetic layer, a metal spacer layer, a ferromagnetic layer, a metal spacer layer, a ferromagnetic reference layer, a non-metal spacer layer and a ferromagnetic free layer from bottom to top; and wherein annealing is carried out when the blocking temperature of the anti-ferromagnetic layer is reached, and same-direction external magnetic fields are applied during cooling, thereby obtaining the push magnetoresistive sensor unit and the pull magnetoresistive sensor unit having opposite magnetization directions of the reference layer.

9. The single-package high-field magnetoresistive angle sensor according to claim 4, wherein all the magnetoresistive sensor units are of a single-stack-layer structure which comprises an anti-ferromagnetic layer and a ferromagnetic reference layer; and wherein the anti-ferromagnetic layer of the magnetoresistive sensor unit is heated with laser to reach the blocking temperature thereof or higher, then two or four external magnetic fields along orthogonal directions are separately applied, and the anti-ferromagnetic layer is cooled to room temperature, thereby forming push arms and pull arms of the orthogonal push-pull magnetoresistive bridges.

10. The single-package high-field magnetoresistive angle sensor according to claim 4, wherein in the orthogonal push-pull magnetoresistive bridges, a multi-layer thin film structure of one bridge arm or two bridge arms having opposite magnetization directions of the reference layer corresponding to the push-pull magnetoresistive bridge in one direction comprises a first anti-ferromagnetic layer, a ferromagnetic layer, a metal spacer layer, a ferromagnetic reference layer, a non-metal spacer layer and a ferromagnetic free layer from bottom to top, or comprises a first anti-ferromagnetic layer, a ferromagnetic layer, a metal spacer layer, a ferromagnetic layer, a metal spacer layer, a ferromagnetic reference layer, a non-metal spacer layer and a ferromagnetic free layer from bottom to top;

a multi-layer thin film structure of one bridge arm or two bridge arms having opposite magnetization directions of the reference layer corresponding to another push-pull magnetoresistive bridge orthogonal to the push-pull magnetoresistive bridge comprises a second anti-ferromagnetic layer, a ferromagnetic layer, a metal spacer layer, a ferromagnetic reference layer, a non-metal spacer layer and a ferromagnetic free layer from bottom to top, or comprises a second anti-ferromagnetic layer, a ferromagnetic layer, a metal spacer layer, a ferromagnetic layer, a metal spacer layer, a ferromagnetic reference layer, a non-metal spacer layer and a ferromagnetic free layer from bottom to top; and annealing is carried out when blocking temperatures of the first anti-ferromagnetic layer and the second anti-ferromagnetic layer are reached, and two external magnetic fields in orthogonal directions are separately applied during cooling, thereby obtaining the push magnetoresistive sensor units and the pull magnetoresistive sensor units of the push-pull magnetoresistive bridges having orthogonal and opposite magnetization directions of the ferromagnetic reference layer.

11. The single-package high-field magnetoresistive angle sensor according to claim 2, wherein each magnetoresistive sensor unit die corresponds to one soft magnetic flux attenuator, and the soft magnetic flux attenuators are located on the surface of all the magnetoresistive sensor units on the magnetoresistive sensor unit die.

12. The single-package high-field magnetoresistive angle sensor according to claim 2, wherein each magnetoresistive bridge arm where the magnetoresistive sensor units are located corresponds to one soft magnetic flux attenuator, and the soft magnetic flux attenuators are located on the surface of all the magnetoresistive sensor units on the magnetoresistive bridge arm.

13. The single-package high-field magnetoresistive angle sensor according to claim 2, wherein each magnetoresistive sensor unit corresponds to one soft magnetic flux attenuator, and the soft magnetic flux attenuator is located on the surface of the magnetoresistive sensor unit.

14. The single-package high-field magnetoresistive angle sensor according to claim 2, wherein an input end and an output end of the push-pull magnetoresistive bridge are connected to pins on a same lead frame through leads.

15. The single-package high-field magnetoresistive angle sensor according to claim 14, wherein the lead frame and the push-pull magnetoresistive bridge are sealed in plastics to form a standard semiconductor package.

16. The single-package high-field magnetoresistive angle sensor according to claim 2, wherein each magnetoresistive sensor unit die is tested and graded before assembly, so that transmission curves of the magnetoresistive sensor unit dice fit each other more desirably.

17. The single-package high-field magnetoresistive angle sensor according to claim 1,
wherein the magnetoresistive sensor units are located on the magnetoresistive sensor unit die,
wherein four magnetoresistive sensor unit dice are provided and are arranged around an application specific integrated circuit (ASIC), so that the push-pull magnetoresistive bridges have a common geometric center, and
wherein bond pads of the magnetoresistive sensor unit dice are closely adjacent to each other.

18. The single-package high-field magnetoresistive angle sensor according to claim 3,
wherein the magnetoresistive sensor unit dice are located right above the application specific integrated circuit (ASIC),
wherein the magnetoresistive sensor unit dice in four rotational phases are arranged in a manner of being rotated by 90 degrees from one another, and
wherein a short side of any magnetoresistive sensor unit die is arranged side by side with a long side of the adjacent magnetoresistive sensor unit die.

19. The single-package high-field magnetoresistive angle sensor according to claim 17, wherein the ASIC comprises an electrostatic discharge (ESD) protection circuit.

20. The single-package high-field magnetoresistive angle sensor according to claim 17, wherein the ASIC comprises an electrostatic discharge (ESD) protection circuit and a processing circuit configured to perform calculation on the outputs of the two push-pull magnetoresistive bridges in orthogonal axial directions, the processing circuit enabling an angle value to be output in a digital form.

* * * * *